US008824147B2

(12) United States Patent
Caron et al.

(10) Patent No.: US 8,824,147 B2
(45) Date of Patent: Sep. 2, 2014

(54) FLUID-COOLED ELECTRICAL EQUIPMENT, AVIONIC RACK TO RECEIVE SUCH EQUIPMENT AND AIRCRAFT EQUIPPED WITH SUCH RACKS

(75) Inventors: Jean-Christophe Caron, Leguevin (FR); Philippe Mairet, Toulouse (FR); Vincent Rebeyrotte, Colomiers (FR); Olivier Roujean, Toulouse (FR)

(73) Assignee: Airbus Operations S.A.S., Toulouse (FR)

( * ) Notice: Subject to any disclaimer, the term of this patent is extended or adjusted under 35 U.S.C. 154(b) by 421 days.

(21) Appl. No.: 13/212,591

(22) Filed: Aug. 18, 2011

(65) Prior Publication Data

US 2012/0069519 A1   Mar. 22, 2012

(30) Foreign Application Priority Data

Aug. 19, 2010   (FR) ..................................... 10 56683

(51) Int. Cl.
 *H05K 7/20* (2006.01)
 *F28F 7/00* (2006.01)
 *F25D 23/12* (2006.01)

(52) U.S. Cl.
 USPC .......... 361/702; 361/699; 361/727; 165/80.4; 165/80.5; 174/547; 62/259.2

(58) Field of Classification Search
 CPC .............................. H05K 7/20781; G06F 1/20
 USPC ....................... 361/679.46–679.54, 688–723; 165/80.4, 104.33; 257/714, 716; 174/15.1
 See application file for complete search history.

(56) References Cited

U.S. PATENT DOCUMENTS

| | | | | |
|---|---|---|---|---|
| 3,956,673 | A * | 5/1976 | Seid | 361/690 |
| 4,493,010 | A * | 1/1985 | Morrison et al. | 361/698 |
| 5,177,666 | A * | 1/1993 | Bland et al. | 361/689 |
| 5,348,482 | A | 9/1994 | Rudy, Jr. et al. | |
| 6,807,056 | B2 * | 10/2004 | Kondo et al. | 361/689 |
| 7,515,418 | B2 * | 4/2009 | Straznicky et al. | 361/702 |
| 7,885,070 | B2 * | 2/2011 | Campbell et al. | 361/699 |
| 7,911,793 | B2 * | 3/2011 | Attlesey | 361/699 |
| 8,035,956 | B2 * | 10/2011 | Davison | 361/679.02 |
| 2008/0123297 | A1 * | 5/2008 | Tilton et al. | 361/700 |
| 2009/0260777 | A1 | 10/2009 | Attlesey | |
| 2010/0103618 | A1 * | 4/2010 | Campbell et al. | 361/699 |

OTHER PUBLICATIONS

French Preliminary Search Report issued Apr. 19, 2011, in French 1056683, filed Aug. 19, 2010 (with English Translation of Category of Cited Documents).

* cited by examiner

*Primary Examiner* — Zachary M Pape
(74) *Attorney, Agent, or Firm* — Oblon, Spivak, McClelland, Maier & Neustadt, L.L.P.

(57) ABSTRACT

This invention relates to a fluid-cooled electronic equipment item, an avionic rack to receive such an equipment item and an aircraft equipped with such racks.

The electronic equipment items are connected to the avionic rack on the one hand electrically (C3-C4) and on the other hand fluidically (36'-37, 45'-44) to a system of pipes (30a, 30b) on at least one cold source for a cooling fluid (30). A heat-dissipating electronic board (35) is equipped with a dissipated-heat collector plate (61-65), in which fluid circulation channels are implemented, connected via quick-disconnect fluidic couplings (42, 39) to quick-disconnect fluidic couplings of the system of pipes. These devices allow the equipment to be removed from or inserted into the rack (32-EE) or the electronic board (35) to be removed from or inserted into the electrical equipment (33-35).

12 Claims, 6 Drawing Sheets

FLUID-COOLED ELECTRICAL EQUIPMENT, AVIONIC RACK TO RECEIVE SUCH EQUIPMENT AND AIRCRAFT EQUIPPED WITH SUCH RACKS

This invention relates to a fluid-cooled electronic equipment item, an avionic rack to receive such an equipment item and an aircraft equipped with such racks.

Electronic equipment items mounted in avionic racks are known in the state of the art. An electronic equipment item comprises in a frequently metal packaging, also referred to as housing, envelop, body or "packaging," a set of heat-dissipating electronic boards. An avionic rack is a "shelf"-type mechanical structure designed to accommodate various electronic equipment items provided for operating the aircraft and its services. The avionic rack makes it possible to removably connect one or more electrical equipment items mechanically and electrically to the various on-board systems—communication, power distribution, control, etc. systems—of the airplane.

A standard exists for this type of device, ARINC standard 600, in which the size of the electronic equipment items inserted into the avionic rack is specified. In each level of the avionic rack, there is inserted a jet of cooling air produced as forced ventilation.

Such a forced-ventilation jet is produced by a system for production of pressurized air which makes it possible to cool the various electrical equipment items with fresh air. It is installed between the actual shelf and an electrical and mechanical adaptation tray permanently fastened onto the shelf by two edges thereof.

Figure 1A:
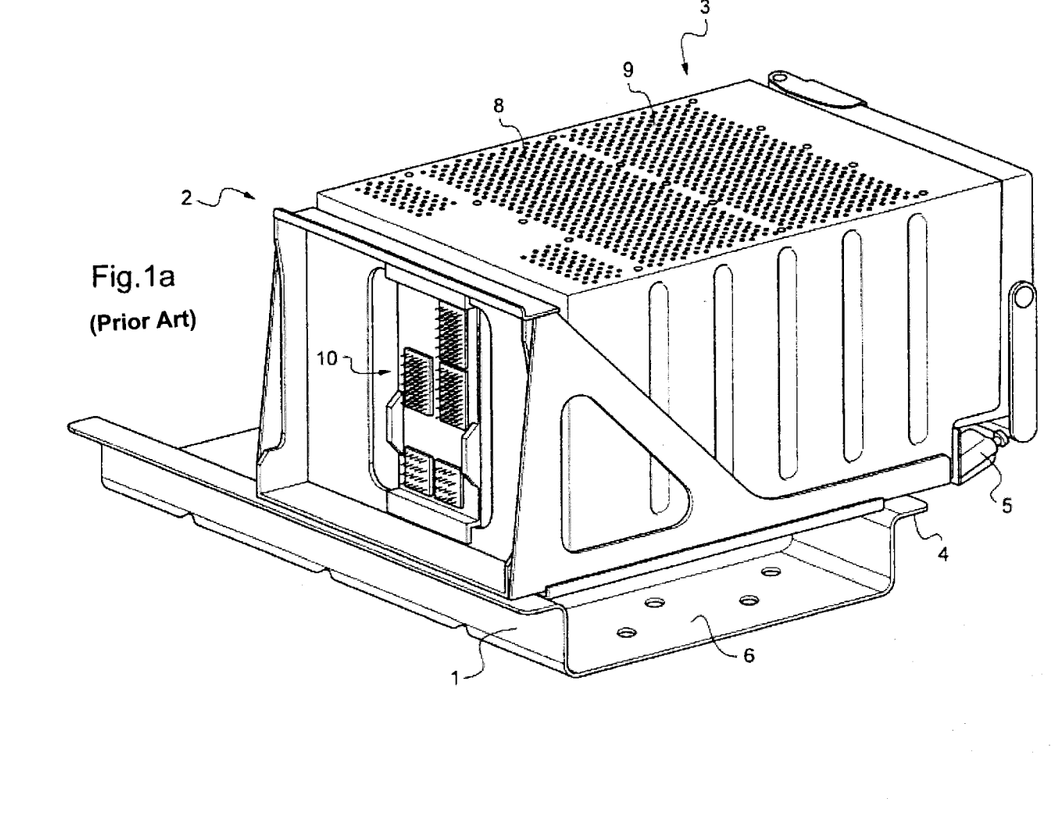
FIGS. 1a and 1b and 2 are views in perspective of the electronic equipment mounted in a tray as well as dissipating electronic boards mounted removably in an electrical equipment item according to the state of the art.
Figure 1B:
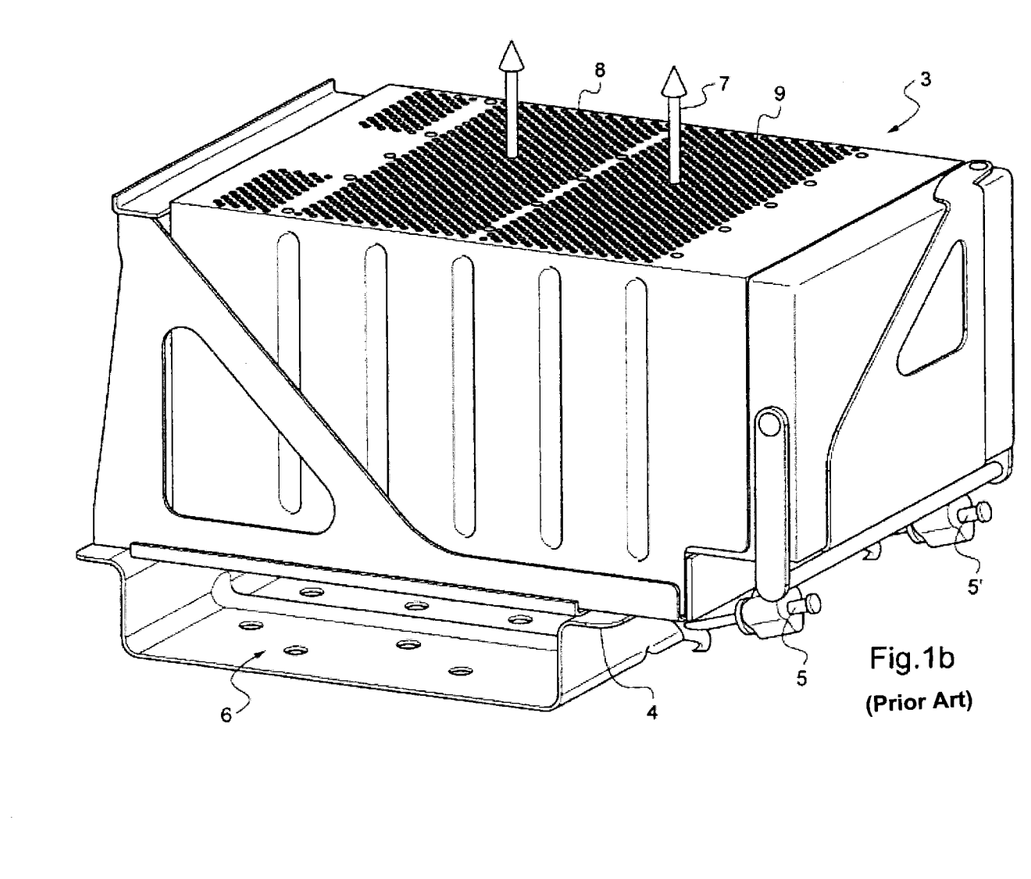

On FIGS. 1a and 1b, two views in perspective of an electronic equipment item inserted on a mechanical and electrical adaptation tray, mounted on a shelf 1, have been shown. In this way several electrical equipment items may be disposed, each on an electrical and mechanical adaptation tray, along the shelf. The avionic rack may comprise several shelves, one above the other.

Electrical and mechanical adaptation tray 2 is placed crosswise to the direction of the shelf, on the latter. Tray 2 is fastened to shelf 1 by screws (not shown). Tray 2 has a vertical part that bears the connections specific to the airplane 10 and a horizontal part placed on edges 4 of shelf 1.

Electrical equipment 3 is installed by insertion into electrical and mechanical adaptation tray 2 and is fastened removably there with the aid of screws 5 and 5' which, on the one hand, interlock the electrical equipment in the tray and, on the other hand, impart an oblique translatory motion so as to provide a connection of the connections exclusive to the electronic equipment 3 to airplane-specific connections 10 on electrical and mechanical adaptation tray 2.

When it is wished to remove electronic equipment 3 for repair, it suffices to unscrew screws 5 and 5' and to remove electronic equipment 3.

When the system for production of pressurized air is connected to the section of the shelf, a jet of pressurized air 6 goes through the space between the flanks of the section of shelf 1 and the housing that surrounds electronic equipment 3. Holes on the base of the packaging or housing of electronic equipment 3 and facing holes on the horizontal part of tray 2 place the inside of electronic equipment 3 and the air jet 6 in communication.

Air then is taken from jet 6, goes through the mass of the electronic equipment to the right of the air intake formed in this way on the air jet and goes out again through apertures 8 and 9 along a warmed-up airflow 7 that mixes with the ambient air of the avionic rack.

Figure 2:
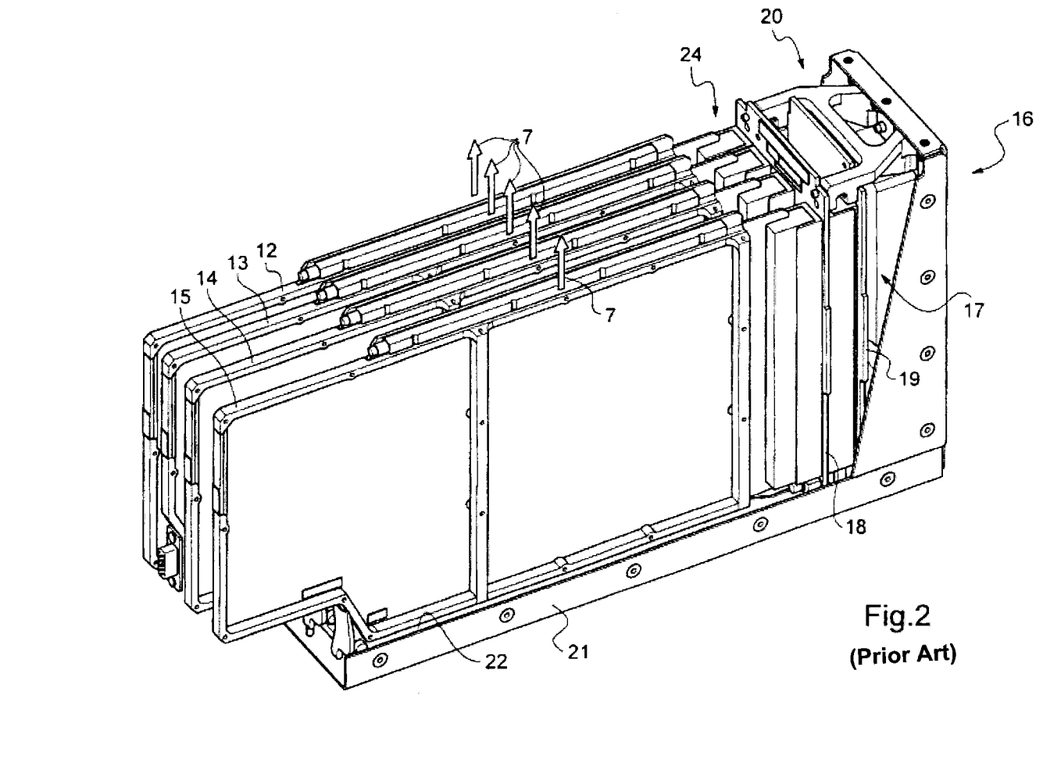

An exemplary implementation of the state of the art has been shown on FIG. 2. In the system used according to ARINC standard 600, on FIG. 2 the removable electronic equipment has a base 21 of the packaging bearing a slide-holder support 22 in each slide of which an electronic board 12 to 15 is inserted.

Each card is disposed vertically and has a side edge, on the right on FIG. 2, which comes to engage into connectors belonging to sub-rack bottom 20, such as connector 24.

Sub-rack bottom 20 may comprise several sub-rack base boards 18, 19. The base of sub-rack 20 further has, toward the rear of FIG. 2, connectors 17 that are intended to come to engage in the avionic connections (FIG. 1a) on electrical and mechanical adaptation tray 2 (FIGS. 1a and 1b).

The flow of ventilated air taken from air jet 6 passes between the boards along airflow 7 on FIG. 2.

This air cooling principle proves to be inadequate for regulating the temperature of certain electrical components laid out on certain electronic boards.

In fact it has been seen that the power density increases constantly whereas the acceptable temperature for these components tends to decrease with the increase of the clock speed.

Blown-air cooling, used in particular according to ARINC standard 600, thus has limitations especially in the following cases:
  when the dissipated power in places is too great because an electronic component is highly dissipative;
  when there is a depressurization of the avionic bay, or even a total loss of ventilation by the airplane.

In such situations, temperature control of the avionic rack would require:
  heavy and cumbersome cooling systems, incompatible with the constraints of avionic integration or
  an impractical scenario of aeraulic cooling of the electrical equipment:
  a disregard for the maximum temperatures acceptable for the components and the materials of the electrical equipment, in particular entailing a risk of irreversible physical damage;
  a significant reduction of the electrical and software functionalities of the electrical equipment installed and cooled;
  a decline in overall reliability since an increase in the temperature brings about a decline in the life of the cooled electrical equipment.

Furthermore, the design of an avionic equipment item is often the result of a compromise with at least one of the following constraints:
  a small additional bulk in the electrical equipment of the avionic rack;
  keeping to an inter-board space between two consecutive boards in the electrical equipment;
  keeping to a dual replaceability of the boards in the electrical equipment on the one hand and of each electrical equipment item on the shelf, on the other hand;
  maintenance of an effective cooling of highly dissipative components during pressurization failures of the airplane or total ventilation failures; and
  reduction of bulk of the avionic equipment so as to keep to the general problem in which any new layout should be expressed by limited operating costs.

To this end, this invention is intended to remedy at least one of the aforesaid drawbacks. It relates to an electronic equipment item comprising a packaging and containing at least one heat-dissipating electronic board connected electrically to a sub-rack bottom assembly. The electronic equipment of the invention comprises at least one crosspiece integral with the sub-rack bottom which bears quick-disconnect fluidic couplings for connection to a cooling fluid system outside the said equipment, the said quick-disconnect couplings being accessible from the outside of the body, and a least one heat collector passage on the said at least one electronic board being fluidically connected to the said quick-disconnect couplings, the board being equipped with at least one metal heat-collector plate which bears the said quick-disconnect couplings, respectively for intake and output of cooling fluid.

An advantage of this arrangement is that the electrical equipment and its electronic boards may be cooled with outside cooling fluid while allowing the equipment to be disassembled and reassembled on the cooling fluid system outside the said equipment.

Moreover, the presence of a heat-collector plate bearing the couplings makes it possible to reduce the number of the latter and the number of connections for the cooling fluid system.

In particular, by virtue of this arrangement it is possible, with only two quick-disconnect couplings, to clear away all the components of the board in order to cool them.

According to other advantageous characteristics:
the said at least one electronic board bears at least one heat collector plate traversed by fluid circulation channels connected by quick-disconnect fluidic couplings connected to corresponding quick-disconnect fluidic couplings integral with the said at least one crosspiece, the quick-disconnect fluidic couplings of the said at least one crosspiece being interconnected through a distribution chamber, the said at least one board being able to be removable on the slide of a slide-holder support; an advantage of this arrangement is to allow both fluidic cooling by means of the heat collector plate and a disassembly and reassembly of the electronic board in the equipment;
the heat collector plate comprises a plate machined in general shapes adapted to the thermal zones of the electronic board and the fluid circulation channels connected to the said quick-disconnect fluidic couplings, the machined plate being closed by a cover the connection of which to the machined plate is made watertight by a weld; an advantage of this arrangement is to allow a production according to a proven method for manufacturing heat collector plates;
the machined plate and/or the cover are made of a material chosen from among materials with low density and high conductivity and thermal capacity, preferably aluminum; an advantage of this arrangement is to minimize the total bulk added by the inventive solution and to maximize the efficiency of the thermal drainage;
the equipment comprises two crosspieces integral with the said sub-rack bottom comprising at least one motherboard that comprises connectors for engaging with electronic board connectors and connectors for connection with an electrical system outside the equipment, a first crosspiece being disposed on one side for the cooling fluid intake circuit and a second crosspiece being disposed on the opposite side for the return circuit on the sub-rack bottom assembly; an advantage of this arrangement is to ensure a distribution of cooling fluid to all the electronic boards while creating a coherent sub-rack base assembly permanently in the electronic equipment.

The invention also relates to a fluid-cooled avionic rack for removable electronic equipment intended to receive at least one electronic equipment item according to the invention. According to the invention, each electronic equipment item is removably connected through a system of pipes to at least one cold source of a cooling fluid.

An advantage of this arrangement is to ensure the dual replaceability of a board or of the electronic equipment in the context of an outside fluid cooling.

According to other advantageous characteristics:
since the rack is of the type in which at least one electronic equipment item is mounted in a mechanical and electrical adaptation tray, each adaptation tray bears first quick-disconnect fluidic couplings for being connected to the pipes of the cooling fluid system, and second quick-disconnect couplings connected to the said first quick-disconnect fluidic couplings and which provide a removable fluidic connection with the quick-disconnect couplings of the equipment when it is removed from or inserted into its adaptation tray in the rack; an advantage of this arrangement is to ensure the assembly or disassembly of an electrical equipment item in a rack provided with adaptation trays, while retaining the advantage of fluid cooling of each electronic equipment item;
at least one electronic equipment item comprises a slide-holder support equipped with slots in at least one inter-slide space, the said at least one removable electronic equipment item being surrounded by a packaging at least one face of which, parallel to the slide-holder support, is equipped with air passages, the fluidic cooling of the boards inside the removable equipment cooperates with a forced-air cooling provided by at least one air jet circulating in a shelf of the rack, the mechanical and electrical adaptation tray, mounted on the said shelf, comprising a zone of holes placing the inside of the electronic equipment item in contact with the said air jet with the aid of a joint that delimits a pressure zone between the tray and the slide-holder support establishing a flow of cooling air between the boards; an advantage of this arrangement is to ensure the dual cooling by air and by outside cooling fluid, and in this way to compensate for ventilation malfunctions or failures or depressurization of the avionic hold;
the cooling fluid is liquid water.

Finally the invention relates to an aircraft comprising an avionic rack according to the invention.

The main advantages of the invention are to make it possible to convey the cooling liquid to the ARINC electrical and mechanical adaptation tray and to have the use of quick hydraulic connections which make it possible, by virtue of appropriate quick-disconnect couplings, to disconnect under pressure the various components used in the cooling system of the dissipating electronic board as well as the equipment itself when it can be moved or disassembled from the electrical and mechanical adaptation tray.

Furthermore, the invention makes it possible to use a specific fluidic routing for passing the cooling liquid on to the electronic boards of the equipment.

The invention finally allows a circulation of the cooling liquid as close as possible to the electronic components that have a critical nature on the thermal level. It allows the warmed-up liquid to leave the boards, then the equipment and only finally the electrical and mechanical adaptation tray, to return to the cooling source.

Other characteristics and advantages of this invention will be better understood with the aid of the description and the attached Figures which are.

Figure 3:
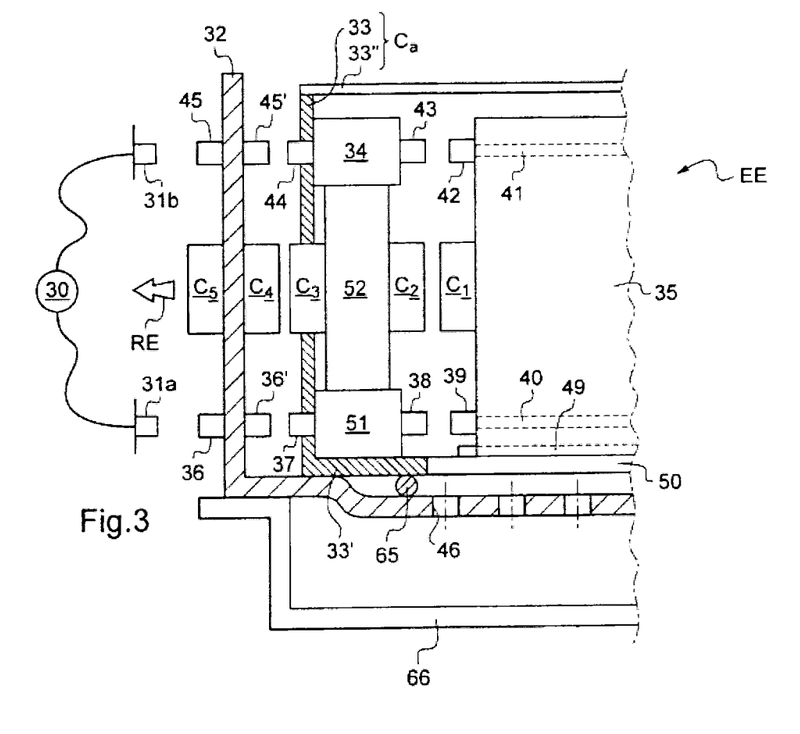
FIG. 3 is a functional diagram of the device of the invention.

A schematic view of an embodiment of a part of an avionic rack according to the invention taken on board an aircraft has been shown on FIG. 3. There have been shown thereon successively, from left to right:

electrical and mechanical adaptation tray 32 comprising a vertical part bearing the avionic connections in a central part not shown, and a horizontal part that comes into contact with shelf 66 similar to shelf 1 of FIG. 1a or 1b;

an equipment packaging Ca consisting of a cover 33" and a base 33 with a support part 33' for a slide-holder support 49.

Several heat-dissipating electronic boards, such as board 35, are inserted removably in a slide of slide-holder support 49 by their lower part on the drawing.

Each board to be cooled comprises various electronic components such as microcontrollers, RAMs or passive electronic components such as connectors. A metal plate placed in thermal coupling at least with the most heat-dissipating components is mounted on one or the other of the faces of the electronic board. In the metal mass of the heat collector plate there are arranged channels in which the cooling liquid circulates, such as the channels shown schematically by tubes 40 and 41.

The channels open onto a quick-disconnect fluidic coupling 39 for intake of a cooling fluid and onto a quick-disconnect fluidic coupling 42 for return of cooling fluid after same has passed over the various components by way of channels 40, 41 which are interconnected.

Quick-disconnect couplings 39 and 42 each consist mainly of a male or female connector element and a valve, disposed in series, so that as soon as the quick-disconnect coupling is separated from its receiving quick-disconnect coupling, no leakage develops between the two parts of the open cooling circuit. The intake and outtake quick-disconnect couplings are connected through fluidic parts, that will be described below, to the pipes of a system for distribution of the cooling fluid in the avionic rack. The piping, or set of conduits or flexible tubings, is connected to a cooling fluid source 30. The piping comprises a flexible outtake tubing 31a which is placed in fluidic contact with quick-disconnect intake coupling 39 of board 35 and a return flexible tubing 31b which is placed in fluidic contact with quick-disconnect outtake coupling 42 of board 35.

Board 35 may be connected to or disconnected from electronic equipment EE. For this purpose, the various components interposed between pipes 31a and 31b of the avionic rack and quick-disconnect couplings 42 and 39 of the electronic board allow a connection/disconnection of the electronic board in equipment EE, even when the cooling system is connected.

For this purpose, electrical and mechanical adaptation tray 32 bears pairs of outtake 45, 45' and intake 36, 36' quick-disconnect couplings which allow a connection to return flexible tubing 31b for quick-disconnect coupling 45 and to flexible tubing 31a for quick-disconnect coupling 36.

Quick-disconnect coupling 45 is suitably connected to quick-disconnect coupling 45'. Quick-disconnect coupling 45' is disposed on the other side of the vertical part of tray 32 inside tray 32 facing the vertical part of base 33. Likewise, quick-disconnect coupling 36 is connected by a suitable pipe to a quick-disconnect coupling 36' facing base 33.

When electronic equipment EE is inserted on tray 32, quick-disconnect couplings 44 and 45' are connected, as well as quick-disconnect couplings 37 and 36', thus establishing a fluidic cooling circuit with cold source 30.

Likewise, in order to ensure a protected connection between board 35 and pairs of couplings 44 and 37 of base 33, there is provided a quick-disconnect coupling 43 connected by a suitable pipe to quick-disconnect coupling 44 and a quick-disconnect coupling 38 connected by a suitable piping to quick-disconnect coupling 37 on base 33.

The fluidic connection of quick-disconnect couplings 42 and 43 on the one hand, and 39 and 38, on the other hand, ensures a removable fluidic connection of the board with source 30.

In a specific embodiment of the invention, base 33 is equipped with a sub-rack bottom formed between two upper 34 and lower 51 crosspieces which each bear pairs of couplings 44 and 43 for fluid return on upper crosspiece 34, and 37 and 38 for fluid intake on lower crosspiece 51.

On FIG. 3, the sub-rack bottom boards are disposed in space 52 between upper crosspiece 34 and lower crosspiece 51.

In one embodiment, each crosspiece is equipped with means for interlocking the crosspiece with the boards of sub-rack bottom 52 as well as connection pipes and quick-disconnect couplings in pairs 44, 43 on the one hand and 37, 38 on the other hand.

As it is furthermore known, each electronic board 35 is equipped with board-edge connections C1. Sub-rack bottom 52 bears connections C2 adapted for receiving connections C1 of each board 35 inserted in electronic equipment EE. Finally, sub-rack bottom connections C2 are electrically connected to connections C3, integral with the sub-rack bottom, and disposed facing connections C3 of electrical and mechanical adaptation tray 32. Connections C4 of tray 32 are themselves directly linked to wiring system C5 of the avionic rack.

This arrangement ensures the dual replaceability of electronic equipment EE on the electrical and mechanical adaptation tray 32 on the one hand, and of each electronic board, such as board 35, in equipment EE on the other hand.

Figure 4:
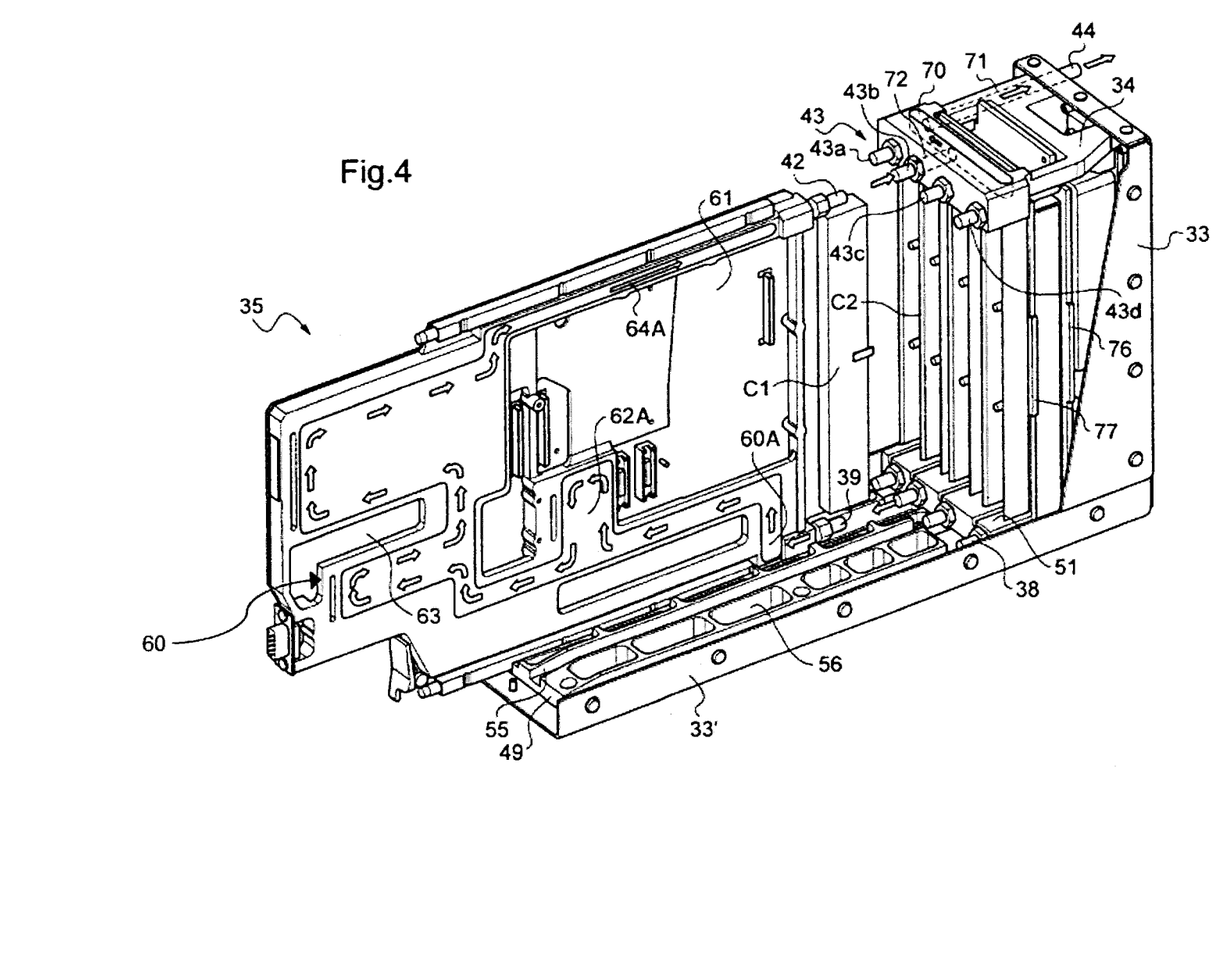
FIG. 4 is a schematic view in perspective of a part of an avionic rack according to a specific embodiment of the invention.

A specific embodiment of an electrical equipment item intended for an avionic rack according to a specific embodiment of the invention has been shown on FIG. 4. On FIG. 4, the same elements as those of FIG. 3 bear the same reference numbers.

On FIG. 4, base 33, 33' comprises a vertical part 33 which is intended to face the inside of the vertical part of tray 32 (FIG. 3) while horizontal part 33' of the base comes into contact with the horizontal part of tray 32.

On FIG. 4, the base is shown with the sub-rack bottom assembly and the insertion of a board to be cooled in progress.

The base, in its horizontal part 33', bears a slide-holder support 49, 55, 56 which has, in the embodiment shown, four slides into each of which a removable electronic board such as board 35 is intended to engage.

Board 35 has a lower longitudinal edge which engages by sliding into the slide corresponding thereto on slide-holder support 49 and a side edge, to the right on FIG. 4, that bears a board-edge connector C1.

When the operator completes the motion of insertion of board 35, connector C1 engages on reciprocal sub-rack bottom connector C2.

Furthermore, board 35 is equipped with a heat collector or coolant plate 60 which bears cooling fluid intake and outtake quick-disconnect couplings 39 and 42 respectively.

Coolant plate 60 comprises thermal energy storage masses that are intended to come to fit over the most heat-dissipating electronic components and grooves such as groove 61 that make it possible to balance the heat dissipation over the board and the plate.

A system of channels 60A, 62A, 64A, indicated by arrows, is established in the metal mass of the coolant plate. The system of channels brings the cooling fluid, provided via quick-disconnect couplings 39 and 42, as close as possible to the warm zones of electronic board 35. The system of channels implements closing of the fluidic cooling circuit between quick-disconnect couplings 39 and 42. The system of channels follows different paths in the thickness of the board so as to carry away the heat dissipated by the thermally dissipative electronic components.

In a specific embodiment, heat collector plate 60 contributes to increasing the mechanical rigidity of electronic board 35. For this purpose, in a specific embodiment, heat collector plate 60 is mounted on the printed circuit of electronic board 35 to be both in contact with the most dissipative electronic components and with the crosspieces not shown on electronic board 35 and set up in a given manner in order to increase the mechanical rigidity of electronic board 35.

All of these arrangements of a heat collector plate on each electronic board such as board 35 ensure observance of an inter-board interval between two consecutive boards in the equipment, determining in particular the choice of a material with high thermal absorption capacity, a flow of cooling fluid from the cold source (30 FIG. 3), a developed length as close as possible to the thermal couplings with the heat-dissipating components on the electronic board along with a diameter of the cooling channels in the collector plate.

Furthermore, the choice of a thickness of the heat collector plate 60 and the arrangement of grooves 61, 63 in this plate at places of the electronic board less productive of thermal dissipation ensures minimization of the weight of the solution provided. It is necessary, in fact, to keep to the avionic constraints for reduction of on-board weights for the purpose of reducing the operating costs of the aircraft in which the electrical equipment of the invention is carried.

In the embodiment of FIG. 4, a sub-rack bottom assembly is provided which is integral with vertical part 33 of the base of the electrical equipment.

The sub-rack bottom is contained between two upper 34 and lower 51 crosspieces respectively. Two sub-rack bottom boards 76 and 77 respectively are mounted vertically between the two crosspieces 34 and 51 so as to bear, on the one hand, connectors such as connector C2 for engaging with the various electronic boards, such as board 35, inserted in the electronic equipment and, on the other hand, connectors not visible on the right portion of FIG. 4 and which engage on avionic connections 10 mounted on tray 2 (see FIG. 1a).

Upper crosspiece 34 which is more or less identical to lower crosspiece 51 now is going to be described in detail.

Upper crosspiece 34 is made of a molded plastic material and bears a quick-disconnect coupling 44 which allows connection to a reciprocal quick-disconnect coupling of tray 32, not shown on FIG. 4 (see FIG. 3), and as many quick-disconnect couplings as there are electronic boards provided, such as quick-disconnect couplings 43a-43d.

On FIG. 4, board 35 is shown in the process of insertion and is to come to engage with quick-disconnect coupling 43b. Coupling 43b is connected via an inner pipe 72 to a distribution chamber 70 which is itself connected to quick-disconnect coupling 44 via a pipe 71.

In this way, it is possible to distribute all the return flows such as the flow returning via quick-disconnect coupling 43b to quick-disconnect coupling 44.

The same arrangement is contemplated for cooling fluid intake crosspiece 51.

In this avionic rack construction according to the invention, by virtue of the quick-disconnect couplings it is possible to disconnect the pipes such as pipes 31a and 31b (FIG. 3) or even to disconnect the entire removable electrical equipment by removing it from base 33, 33' or else by taking down one or the other of the boards such as board 35. By virtue of these fluidic circuit arrangements via quick-disconnect couplings, abidance by a dual replaceability of the boards in the electrical equipment, on the one hand, and of each electronic equipment item on the shelf of the avionic rack, on the other hand, is ensured.

This invention advantageously is combined with a forced-air cooling system as known from the state of the art.

In such a forced cooling (FIG. 5), electrical and mechanical adaptation tray 2 comprises a vertical part forming back 32, which bears coolant fluid intake quick-disconnect coupling 36 and coolant fluid outtake quick-disconnect coupling 45, as well as the couplings with the quick-disconnect couplings of the base 36' and 45' respectively, as well as the avionic connections shown as 67.

Figure 5:
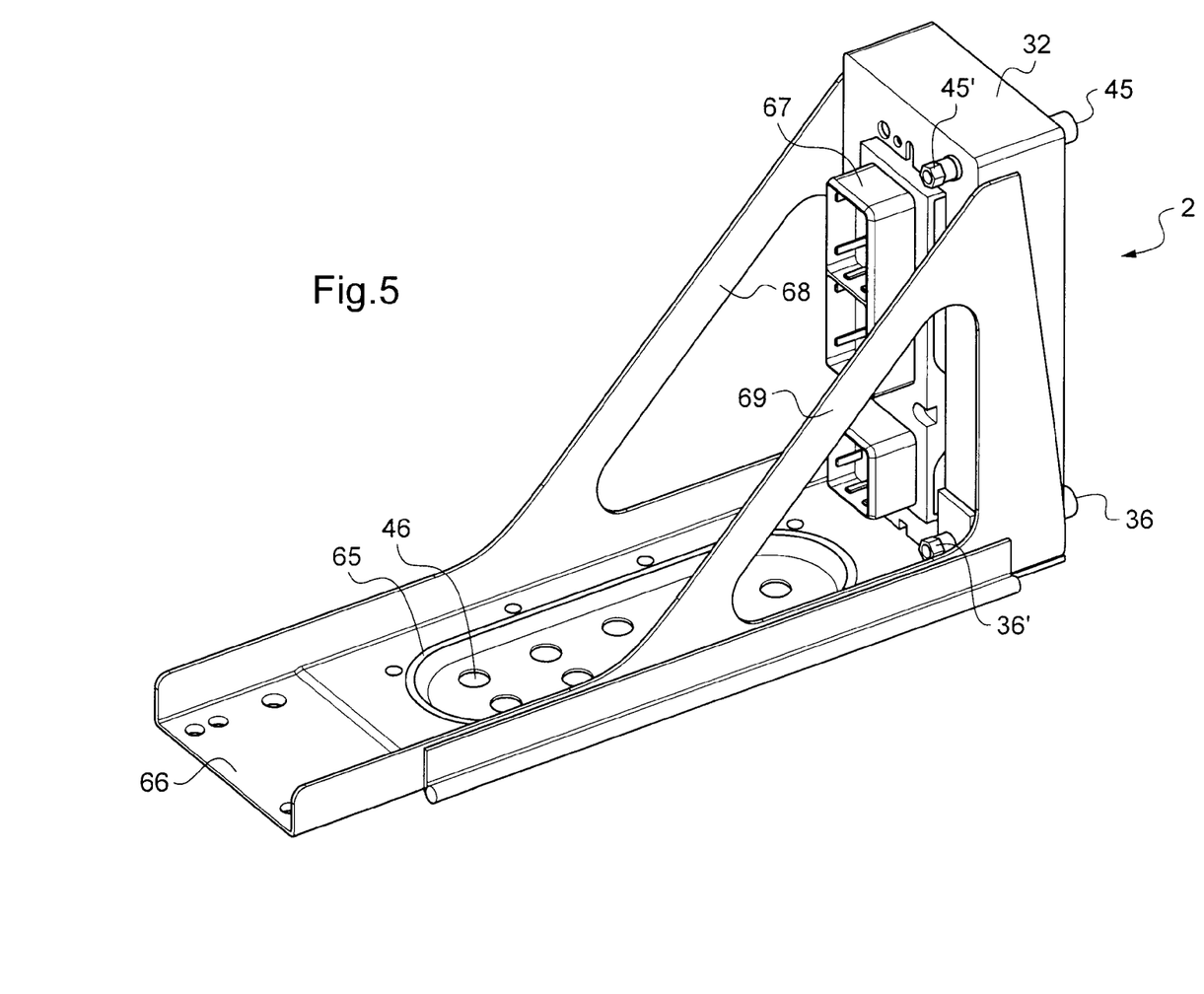
FIG. 5 is a view in perspective of an electrical and mechanical adaptation tray in a specific embodiment of the invention.

A horizontal part 66 forming a seat of the electrical and mechanical adaptation tray is interlocked with back 32 in particular with the aid of angle brackets 68 and 69 between which an equipment item built around a base such as base 33, 33' (FIGS. 3 and 4) comes to be inserted.

In this embodiment of this invention, the tray has, in its horizontal part 66, a zone fitted out with holes 46 surrounded by an aeraulic sealing joint 65. The zone of holes 46 is in fluidic contact with an airflow circulating in the section of a shelf on which the tray is mounted (see FIGS. 1a and 1b).

As has been shown on FIG. 3, horizontal part 33' of the base of the electronic equipment inserted in the tray is equipped with slots 50 which make it possible, inside the packaging of the equipment, to make fluidic contact with the zone of holes 46 of tray 2.

Furthermore, as is shown on FIG. 4, the slide-holder support is equipped with holes 56 at least some of which are in contact with the slots, such as slot 50, from FIG. 3, on horizontal part 33' of the base.

In this way a flow of cooling air through its various apertures is arranged so that the air can escape and bathe the coolant plates of the electronic boards inserted in the electrical equipment in operation. By virtue of this arrangement of a cooling fluid supplied by the heat collector plates mounted on the electronic circuits, it is possible to ensure maintenance of an effective cooling of highly dissipative components during pressurization failures of the airplane, or total ventilation failures.

The material chosen for the heat collector plate is chosen from among materials with low density in order to minimize the total weight of the solution, and with high thermal conductivity and capacity in order to absorb and conduct the dissipated thermal flow toward the cooling liquid of the channels with maximum efficiency. The best compromise in terms of material choice is aluminum.

The channels are implemented in the thickness of the heat collector plate according to a known standard method adapted to the thermal dissipation zones of the electronic board produced by machining. Machining of general forms and drainage channels is implemented. The general forms comprise hollowing-out of material in the zones of the collector plate where exchange of thermal flows is not desired, and blocks, in particular disposed to the right of the most heat-dissipating electronic components. The plate then is "closed" by a cover and the assembly is made watertight by a weld. The weld is implemented on the joining between the machined plate and its cover after quick-disconnect couplings 39 and 42 (FIG. 3) have been installed.

The invention claimed is:

1. Electronic equipment including a packaging and containing at least one heat-dissipating electronic board connected electrically to a sub-rack bottom assembly, comprising:
   at least one crosspiece integral with the sub-rack bottom assembly including a first set of quick-disconnect fluidic couplings for coupling to a cooling fluid system outside the equipment,
   wherein the first set of quick-disconnect fluidic couplings is accessible from outside the packaging,
   wherein the at least one electronic board is equipped with at least one metal heat collector plate, the plate including at least one groove forming at least one channel with the at least one electronic board to guide cooling fluid to warm zones of the at least one electronic board, the at least one channel being fluidcally coupled with the first set of quick-disconnect fluidic couplings for intake and outtake of the cooling fluid,
   wherein the at least one crosspiece includes a second set of quick-disconnect fluidic couplings, and
   wherein the at least one electronic board includes a set of quick-disconnect fluidic couplings to connect to the second set of quick-disconnect fluidic couplings integral with the at least one crosspiece, the at least one crosspiece including a distribution chamber for conveying the cooling fluid between the first set of quick-disconnect fluidic couplings and the second set of quick-disconnect fluidic couplings.

2. The equipment according to claim 1, wherein the heat collector plate includes a machined plate of general forms adapted to thermal zones of the at least one electronic board, and
   wherein the machined plate is closed by a cover via a watertight weld.

3. The equipment according to claim 2, wherein the machined plate or the cover is made of a material having low density and high conductivity and thermal capacity.

4. The equipment according to any one of claims 1, 2, or 3, wherein the sub-rack bottom assembly includes at least one mother-board having connectors for engaging connectors of the at least one electronic board and connectors of an electrical system outside the equipment,
   wherein a first crosspiece of the at least one crosspiece includes a cooling fluid intake circuit and a second crosspiece of the at least one crosspiece includes a cooling fluid return circuit on the sub-rack bottom assembly.

5. The equipment according to claim 3, wherein the material is aluminum.

6. A fluid-cooled avionic rack to receive at least one electronic equipment according to claim 1, wherein the at least one electronic equipment is removably connected via a system of pipes to at least one cold source for providing the cooling fluid.

7. The rack according to claim 6, comprising a mechanical and electrical adaptation tray,
   wherein the adaptation tray includes first quick-disconnect fluidic couplings to connect to the system of pipes of the at least one cold source, and
   wherein the adaptation tray includes second quick-disconnect fluidic couplings fluidically connected to the first quick-disconnect fluidic couplings of the adaptation tray and provides a removable fluidic connection with the set of quick-disconnect fluidic couplings of the electronic equipment.

8. The rack according to claim 7, further comprising a shelf to receive at least one air jet for forced-air cooling,
   wherein the adaptation tray is mounted on the shelf and the shelf includes a zone of holes to place the electronic equipment in contact with the at least one air jet, and
   wherein the packaging of the electronic equipment includes air passages to receive the at least one air jet passed through the shelf.

9. The rack according to claim 8, wherein the shelf includes an aeraulic sealing joint surrounding the zone of holes to prevent leakage of air from the at least one air jet.

10. The rack according to claim 6, wherein the cooling fluid is liquid water.

11. An aircraft comprising at least one avionic rack according to claim 6.

12. The equipment according to claim 1, wherein the packaging includes a slide and a slide holder support, the slide holder support having apertures for guiding cooling air toward the at least one metal heat collector plate of the at least one electronic board.

* * * * *